US 6,535,755 B2

(12) United States Patent
Ehnholm

(10) Patent No.: US 6,535,755 B2
(45) Date of Patent: Mar. 18, 2003

(54) NUCLEAR MAGNETIC RESONANCE APPARATUS AND METHOD

(75) Inventor: Gosta J Ehnholm, Helsinki (FI)

(73) Assignee: Koninklijke Philips Electronics N.V., Eindhoven (NL)

( * ) Notice: Subject to any disclaimer, the term of this patent is extended or adjusted under 35 U.S.C. 154(b) by 215 days.

(21) Appl. No.: 09/809,893

(22) Filed: Mar. 16, 2001

(65) Prior Publication Data
US 2001/0037062 A1 Nov. 1, 2001

(30) Foreign Application Priority Data
Mar. 16, 2000 (GB) ............................. 0006207

(51) Int. Cl.$^7$ ........................ A61B 5/055; G01R 33/20
(52) U.S. Cl. ..................... 600/423; 600/11; 600/459; 324/318
(58) Field of Search ............................. 600/423, 410, 600/411, 422, 436, 459, 462, 9, 11; 324/307, 309, 318, 322

(56) References Cited

U.S. PATENT DOCUMENTS

| 4,825,163 | A | * | 4/1989 | Yabusaki et al. | ............ 324/318 |
| 5,211,166 | A | | 5/1993 | Sepponen | .................... 324/307 |
| 5,262,727 | A | * | 11/1993 | Behbin et al. | .............. 324/318 |
| 5,300,888 | A | | 4/1994 | Webster et al. | ............. 324/315 |
| 5,307,814 | A | * | 5/1994 | Kressel et al. | .............. 600/423 |
| 5,432,450 | A | | 7/1995 | Rubinson | .................... 324/318 |
| 5,451,232 | A | * | 9/1995 | Rhinehart et al. | .......... 600/421 |
| 5,476,095 | A | * | 12/1995 | Schnall et al. | ............... 600/423 |

FOREIGN PATENT DOCUMENTS

| EP | 0 534 607 | 9/1993 |
| GB | 2 245 364 | 1/1992 |
| GB | 2 246 201 | 1/1992 |
| GB | 2 252 245 | 8/1992 |
| GB | 2 279 755 | 1/1995 |
| GB | 2 287 325 | 9/1995 |
| WO | WO 90/02343 | 3/1990 |
| WO | WO 98/01766 | 1/1998 |

OTHER PUBLICATIONS

Raimo P. Joensuu, et al.; "High–Accuracy MR Tracking of Interventional Devices: The Overhauser Marker Enhancement (OMEN) Technique"; MRM 40:914–921 (1998).
K. Golman, et al.; Overhauser–Enhanced MR Imaging (OMRI); ACTA Radiologica, ISSN 0284–1851; pps 10–17.

(List continued on next page.)

Primary Examiner—Hieu T. Vo
(74) Attorney, Agent, or Firm—Thomas M. Lundin

(57) ABSTRACT

The Overhauser effect is a technique for increasing the signal-to-noise ratio of nuclear magnetic resonance signals. Electron spin resonance is set up for example in a contrast agent 14 injected into a patient by means of a transmitter 3 at the end of a probe 1 to excite an area 15. The excited electrons couple to MR active nuclei and increase the population in the higher energy level. Then, when an NMR signal is transmitted and received via coil 5, more MR active nuclei return to the ground state and create a bigger, enhanced, signal detected by the coil 5, hence promoting increased signal-to-noise ratio on an image formed on the monitor 9. In the invention, the Overhauser effect may be applied to an intra-operative situation by means of probe 1 which is inserted, for example, into a patient in a region of interest. According to a preferred feature, the transmitter 3 is also used for heat treatment by means of oscillator 16 in order to destroy diseased tissue, and the temperature dependence of the enhanced NMR signal, corrected for migration of the contrast agent by the ESR signal reflected back along the central conductor 3 into the detector 13, is used to control the temperature and hence the heat treatment operation.

27 Claims, 1 Drawing Sheet

OTHER PUBLICATIONS

Figure 1:
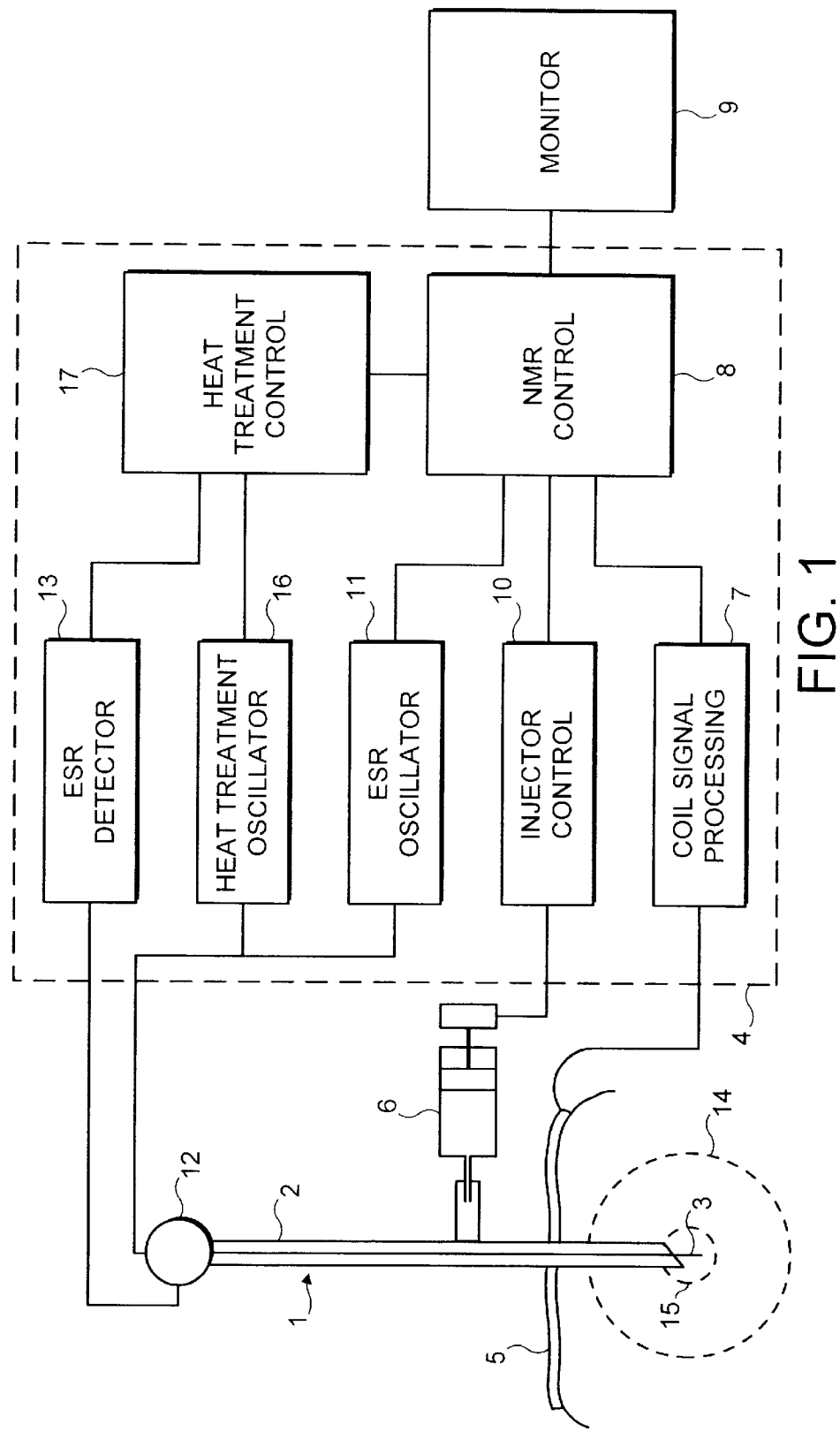

J.H. Ardenkjaer–Larsen, et al.; "EPR and DNP Properties of Certain Novel Single Electron Contrast Agents Intended for Oximetric Imaging"; Journal of Magnetic Resonance 133, pps. 1–12 (1998).

John Bourg, et al.; "Radiofrequency FT EPR Spectroscopy and Imaging"; Journal of Magnetic Resonance, Series B 102, pps. 112–115 (1993).

Periannan Kuppusamy, et al.; "Development and Optimization of Three–Dimensional Spatial EPR Imaging for Bio logical Organs and Tissues"; Journal of Magnetic Resonance, Series B 106, pp. 122–130 (1995).

Periannan Kuppusamy, et al.; "Three–dimensional spectral—spatial EP imaging of free radicals in the heart: A technique for imaging tissue metabolism and oxygenation"; Proc. Natl. Acad. Sci. USA; vol. 91, pp. 3388–3392, Apr. 1994.

* cited by examiner

NUCLEAR MAGNETIC RESONANCE APPARATUS AND METHOD

BACKGROUND

This invention relates to a nuclear magnetic resonance (NMR) apparatus and method, especially NMR enhanced by electron spin resonance (ESR).

NMR can be used to analyze material, in the presence of an applied magnetic field and excitation pulses of r.f. energy, to ascertain the relative quantities of substances within a particular region, based on differences in the resonant frequency of different magnetic resonant (MR) active nuclei and of the same nucleus in different chemical compounds e.g. protons in fat and water (so-called spectroscopy); and NMR can be used, in the presence of an applied magnetic field and excitation pulses of r.f. energy and magnetic field gradients, to produce an image of the spatial distribution of MR active nuclei in a particular region (so-called magnetic resonance imaging—MRI).

The basis of NMR and MRI is the excitation of MR active nuclei to a higher energy level by r.f. pulses, and the measurement of the resulting relaxation signals created after the pulses have ceased as the nuclei return to the lower energy state. The signal-to-noise ratio, which influences image quality, depends on the difference in population of the excited and ground states. The excited state corresponds to MR active nuclei precessing about an axis opposed to the direction of the main field, and the lower energy state corresponds to the MR active nuclei precessing about an axis aligned with the direction of the main field.

Improved signal-to-noise ratio is usually produced in an MR image by increasing the strength of the applied magnetic field, since the precession frequencies of the MR active nuclei are proportional to the applied magnetic field, and the excitation pulse can have greater energy at a higher frequency. However, the magnet is one of the most expensive components of nuclear magnetic resonance apparatus, often using superconducting coils, so that higher fields are usually associated with higher costs.

This invention relates to a technique which has been developed to increase signal-to-noise ratio independent of the strength of the applied magnetic field. In this technique, which involves double resonance, atoms with unpaired electrons, usually paramagnetic, undergo electron spin resonance in the presence of an applied magnetic field together with excitation pulses of r.f. energy, this time of higher frequency than that for producing nuclear magnetic resonance (referred to hereinafter as excitation pulses of electromagnetic radiation). This resonance of the magnetic moments of the spinning electrons couples to the precessing MR active nuclei and excites them to the higher energy level. Then, when spectroscopy or imaging is carried out, higher signal-to-noise ratio in the spectroscopy or imaging is achieved.

There are few substances with unpaired electrons in the human body, so that if spectroscopy or imaging is carried out on the human body, a so-called contrast agent which does have atoms with unpaired electrons is first injected. These atoms couple with atoms of MR active nuclei and excite the latter to their higher energy level.

This so-called Overhauser enhancement has been used to image parts of the human body surrounded by coils to generate the electromagnetic radiation to produce the ESR and to generate r.f. pulses of appropriate frequency to produce NMR (GB-A-2245364, 2246201, 2252245, 2279755, 2287325 and WO 98/01766). The method is described in a publication "Overhauser—Enhance MR Imaging (OMRI)" by K Golman et. al., in Acta Radiologica 39 (1998) 10–17 (Reference 1).

Overhauser enhancement has also been used to improve the visibility of fiducial markers, by making the marker of a mixture of contrast agent and imaging agent, as described in "High-Accuracy MR Tracking of Interventional Devices: The Overhauser Marker Enhancement (OMEN) Technique", by Raimo P. Joensuu et. al. and published in: Magnetic Resonance in Medicine, 40:914–921 (1998) (Reference 2).

SUMMARY

The invention provides a probe for insertion into a region of interest, which comprises a transmitter for generating an electromagnetic field in the region of interest at a frequency to excite electron spin resonance to enhance nuclear magnetic resonance in the region of interest.

The invention makes it possible to analyze localized areas.

The probe is particularly suitable for investigating the human or animal body, particularly the human body, but it could also be used for analyzing inanimate materials.

The probe is intended for use with nuclear magnetic resonance apparatus, particularly magnetic resonance imaging apparatus, although it is also suitable for use in spectroscopy. Magnetic resonance imaging apparatus comprises a magnet for producing a main magnetic field, means for producing pulses of r.f. energy, and means for applying magnetic field gradients. Magnetic resonance imaging apparatus also includes a receive coil for receiving the nuclear magnetic resonance relaxation signals, together with a transmit coil for producing the nmr r.f. excitation pulses, and the transmit coil may be the same as or distinct from the receive coil. The receive coil may be a coil which surrounds the body or a part of the body, or it may be a surface coil. However, the r.f. receive coil and/or the r.f. transmit coil, could be incorporated into the probe if desired.

The probe may include a hollow sheath with the transmitter mounted at the tip of it. An injector for injecting contrast fluid into the region of interest communicating with the hollow interior of the hollow sheath may be provided, and the sheath may form the outer conductor of a co-axial cable, the center conductor of which forms the transmitter. The center conductor may protrude from the end of the co-axial cable, forming an antenna, conveniently of one quarter wavelength in the material in which it is inserted. If desired, however, contrast fluid could be injected by means of a separate injector.

There may be provided means for generating an electromagnetic field at the transmitter for the purposes of heat treatment, for example, the use of heat to destroy diseased tissue, such as in ablation. The frequency of the transmitter for the purposes of ablation is desirably different to that from that used to excite electron spin resonance, but could if desired be the same. The nuclear magnetic resonance signal measured by the nuclear magnetic resonance apparatus may be used to control the ablation process, since the former when Overhauser enhanced is a function of the temperature of the tissue in the region of interest. The variation of the nuclear magnetic resonance signal with other factors can be compensated for by measuring the amount of electromagnetic field used to create electron spin resonance that is absorbed.

The invention also provides nuclear magnetic resonance apparatus in conjunction with the probe according to the invention.

The invention also provides apparatus for producing controlled heat treatment in a region of interest, which comprises means for generating an electromagnetic field in the region of interest at a frequency to excite electron spin resonance to enhance nuclear magnetic resonance in the region of interest, means for producing heat treatment in the region of interest, and means for using the temperature dependence of the enhanced magnetic resonance signal to control the heat treatment.

DRAWINGS

Ways of carrying out the invention will now be described in detail, by way of example, with reference to the drawing.

FIG. 1 is a partly sectional and partly schematic view of the probe and the processing electronics to which it is connected.

DESCRIPTION

Referring to FIG. 1, the probe 1 consists of a rigid needle 2 carrying a central conductor 3, forming a co-axial cable. The end of the center conductor protrudes beyond the end of the needle 2, which has a sharpened tip, and is insulated over that region. The probe 1 is connected to processing electronics 4 of magnetic resonance imaging apparatus. In FIG. 1, the probe is shown inserted into a region of the human anatomy e.g. a breast, and a surface coil 5 is a receive coil of the magnetic resonance imaging apparatus.

The tip of the central conductor 3 extends beyond the co-axial needle 2, forming a dipole transmitter, which is desirably one quarter wavelength long i.e. the tip of the central conductor 3 extends beyond the co-axial needle by a distance of one quarter of the wavelength of the radiation in the material in which it is inserted. During insertion the tip can be retracted into the sheath formed by the needle, to prevent it from bending, or it can be pulled out completely and exchanged for a sharp core needle to cut the way into the tissue. In the former case, the retractable tip is surrounded by a plastic sleeve which fits into the needle and closes it during insertion of the needle. After placement of the probe the needle is slightly withdrawn to expose the tip as desired. The plastic cover extends all the way through the needle, to support and isolate the central conductor, but at the same time leave a channel for the injected agent to pass through. During insertion the channel is closed at the retracted tip, but can be filled by an agent to help tracking, as will be explained below.

Magnetic resonance imaging apparatus comprises a main magnet (not shown) and coils (not shown) for producing magnetic field gradients in the region of interest. The magnetic resonance imaging apparatus may include a transmit coil (not shown), for example, a cylindrical body coil. If desired, the r.f. receive coil 5 could also be used for r.f. transmit to excite nuclear magnetic resonance.

An injector 6 for contrast agent, shown schematically, communicates with the hollow interior of the needle 2. The contrast agent may be, for example, any of the contrast agents referred to in the prior art referred to hereinbefore, especially GB-A-2252245 and WO 98/01766. Typically the contrast agent would be one of the Trityls described in the article "EPR and DNP Properties of Certain Novel Single Electron Contrast Agents Intended for Oximetric Imaging" by J. H. Ardenkjaer-Larsen et. al. in Journal of Magnetic Resonance 133:1 July 1998 (Reference 3).

The nuclear magnetic resonance imaging apparatus operates to produce an image of the region of interest, for example, a suspected tumor in a breast, in the following way.

In the presence of the applied magnetic field, a succession of r.f. excitation pulses are applied to excite nuclear magnetic resonance in the region of interest, and relaxation signals picked up by coil 5 are detected, down-converted and digitized in coil signal processing apparatus 7. Digital signal processing apparatus 8 for controlling the nuclear magnetic resonance procedure is responsible for generating the r.f. excitation pulses and for detecting them, in the presence in each case of appropriate magnetic field gradients, in order to image a series of slices or a volume in the region of interest. The desired region is then displayed on a monitor 9 in accordance with usual magnetic resonance imaging procedure.

The probe 1 enables the image to be enhanced by virtue of the Overhauser effect. Thus, the digital signal processing apparatus 8 also controls an injector control 10 for controlling injection of the contrast agent from the injector 6, as well as an oscillator 11 for generating an electromagnetic field of such a frequency as to excite electron spin resonance in the contrast agent. The electron spin resonance oscillator 11 is connected to the central conductor 3 of the probe 1 via a circulator 12. This is a three port device, which has the effect that the electromagnetic field from the oscillator 11 is coupled to the central conductor 3, while energy reflected back along the central conductor 3 is fed to a port connected to a detector 13 of the electromagnetic field for creating electron spin resonance. The purpose of this will be described hereinafter.

The enhanced magnetic resonance imaging operation thus differs from non-enhanced imaging in that, immediately prior to the sequence of r.f. pulses, the injector control 10 causes the injector 6 to inject contrast agent into the patient, which distributes into the surrounding tissue, for example, at one point in time the region shown dotted as 14. The oscillator 11 is then activated to generate an electromagnetic field at microwave frequency in the region of the tip of the central conductor, for example, in a region indicated by the dotted lines 15. Electron spin resonance is created in the contrast agent in this region, and this couples to the water and other molecules of the tissue in this region to increase the excited state of the MR active nuclei, typically protons, in a process called dynamic polarization. The magnetic resonance imaging sequence is then run as normal, and an improved signal-to-noise ratio is obtained, typically improved 10–50 times.

Preferably this procedure is performed over a time which is of the order of the relaxation times of the protons in the region being examined, or about 0.1 s to a few seconds, which is the time for the protons to become dynamically polarized and for losing the polarization. Preferably a so-called single-shot sequence is used, such as Echo-planar or fast spin-echo, which makes it possible for form a complete image representing the polarized protons at the time of starting the sequence. It is also possible to interleave the microwave esr signal with many proton signals; this makes it possible to use other types of nuclear resonance imaging sequences. That is, after one injection of contrast agent, many esr excitations may follow, with an imaging sequence after each esr excitation.

The main purpose of the probe is for an intra-operative procedure e.g. to destroy diseased tissue. A preferred method will next be explained as an example.

The probe 1 is inserted by a surgeon into a region of a suspected tumor, usually mounted on a frame or otherwise referenced to a patient co-ordinate system, which has been aligned with the magnetic resonance imaging co-ordinate system, in order to be able to produce an image of the tumor on the monitor 9. The probe may create its own opening into the region of the patient, or it may be inserted into access already created by the surgeon. A proton image of the tumor is produced, if desired using Overhauser enhancement to improve local signal-to-noise close to the probe. During the placement Overhauser imaging can also be used for preparing a series of very fast images to follow the process in real time. The probe will show up as a black void in the images. If the tip is not in the center of the diseased region, the probe is repositioned and enhanced imaging is again carried out.

When the tip is in the center of the diseased region, this tissue is destroyed by generating an electromagnetic field at the tip 3 using heat treatment oscillator 16 to generate an electromagnetic field for heating purposes under the control of digital signal processing apparatus 17 for controlling the heat treatment, for example, ablation process. It would normally be convenient for the frequency of the heat treatment oscillator 16 to differ from that of the electron spin resonance oscillator, but they could be the same if desired. After one or more pulses from the heat treatment oscillator 16, a further complex imaging process is carried out. This process, which will be explained in detail below, produces two images, one conventional proton image from the region containing the heat treated part, and one proton image from exactly the same region, differing only by having employed Overhauser enhancement. These images contain information which, correctly interpreted, reveal the distribution of temperature increase produced by the heat treatment probe. The images might be displayed directly, in which case the temperature increase is seen in the Overhauser enhanced image as a signal increase: the pixels from warm regions have more signal than the pixels from cooler ones. Preferably, however, the image information is first processed mathematically and then presented as an image which shows the temperature profile directly. Making successive enhanced images as the heat treatment goes on reveals how the region around the probe is heated compared both to the region further from the probe, and to the images made before heat treatment was started. In this way the heat treatment process can be monitored continuously. Tissue which has been heated long enough to some suitable temperature will be destroyed. The images will help in determining in which region the desired destruction has taken place and so show when to stop the heating. This could be done either manually under the control of the surgeon or according to a predetermined control criteria.

The described method is based on the fact that the Overhauser enhancement is a function of temperature. However, the enhanced and unenhanced proton images also depend on other factors such as the extent to which the contrast agent has distributed, or in other words, on the local concentration of agent. Another such factor is the local concentration of paramagnetic materials, e.g. oxygen, which affect the esr linewidth. The electron spin resonance signal is, therefore, also a function of the local concentration of agent and of linewidth, with the same signal dependence on those factors as for the enhanced nmr signal (although the electron spin resonance signal is not a function of the temperature).

In a more refined version the apparatus is therefore used to compensate for agent and oxygen concentration, so that the digital signal processing apparatus 8 for controlling the nuclear magnetic resonance can be used as a thermometer to measure the temperature in the region of the probe tip. This can then be used as a control signal to cause the heat treatment control to switch off the heat treatment oscillator 16 when a desired temperature has been reached. In another refined version the apparatus is used to measure and display the oxygen concentration in the region of interest, see Reference 6 below.

A quantitative explanation of the methods will next be given:

The signal intensity corresponding to the pixels of an Overhauser enhanced image can, rearranging Equations 1–4 of Reference 1, be written as $$Mz = Mo - 658k\, Mo[1 - exp(-T_{VHF}/T_C)]T_C r_1 cSAT \quad (1)$$

Where we have used the symbols $$Tc = 1/(r_1 c + 1/T_1), \quad (2)$$

to make the notation easier to follow.

The symbols have the following meaning:

Mo is proportional to the nmr signal coming from some volume element (voxel), and also to the amplitude of the corresponding pixel in the proton nmr image. When applying the esr signal, for a time $T_{VHF}$, to dynamically polarize the protons, the signal successively changes: it starts from Mo and ends up as Mz. The rate of change for the dynamic polarization $T_C$ depends on the relaxivity $r_1$ of the agent (its efficiency) multiplied by its local concentration c, and on the spin-lattice relaxation time $T_1$ of the protons. The SAT term represents the consumption of energy of the electrons during the dynamic polarization process. For a strong esr excitation the resonance line becomes saturated and SAT=1.

The important factors for the present invention, are the ones that carry the temperature dependence. The principal one is k, which is called the coupling factor and is strongly temperature dependent in fields of 0.1–1 T. This is described in Reference 3, FIG. 2 and Table 1, from which we find that changing the temperature from e.g. 23 C. to 37 C. changes k by about 10% at a field of 0.25 T. From the same reference we find that $r_1$ also is temperature dependent, increasing with temperature as k, but to a lesser extent. To see how the temperature measurement is to be done in practice we first make the assumption $T_{VHF} \ll T_C$, which can always be fulfilled by making the esr irradiation short enough. We can the use the approximation of the exponential function for small arguments, $exp(-x) \sim 1-x$. Equation 1 then becomes $$Mz = Mo - 658k Mo\, T_{VHF} r_1 cSAT \quad (3)$$

Defining $F(t) = k\, r_1$ as the temperature dependent parameter and solving for it we obtain $$F(t) = (Mo - Mz)/(658 Mo\, T_{VHF} cSAT) \quad (4)$$

The temperature t can now be obtained, provided that we know the function F(t) (or rather its inverse); this can be experimentally measured. The present invention aims, however, to obtain the temperature not only in one point, but as a function of the spatial position in a chosen region inside the body being examined. A preferred way to display this information is to prepare an image, representing the chosen region or part thereof, where the intensity of a displayed pixel represents the temperature of the corresponding voxel. This can be accomplished using Equation 4 provided that we can measure the quantities on the right for each voxel, e.g. by preparing images with similar voxels giving the values for them, solving the equation on a pixel-by-pixel basis, and displaying a new image with pixels according to the solution. The needed images for this are: one image representing Mo, one image for Mz, and one for cSAT. The esr irradiation time $T_{VHF}$ is known in advance and is the same for all voxels.

The desired information is obtained as follows: The Mo image is the regular unenhanced NMR image of the region, without esr signals. The Mz image is the enhanced one obtained after applying the esr radiation. These images are thus prepared using well known methods. However, the cSAT image information is less conventional, and there are two ways of obtaining it, which can be used either singly or in combination.

The first method is to measure the increase in temperature, rather than the absolute temperature itself. This is feasible if the concentration of agent remains constant during the heating process. We can make one set of Mo and Mz images corresponding to e.g. 37 C., or whichever temperature the volume being examined has, and another set after the temperature has been changed, e.g. by heating. Applying Eq. 4 twice, for the known temperature 37 C. and for the unknown one t, dividing the results, we obtain $$F(t) = F(37\ C.)[Mo(t) - Mz(t)]/[Mo(37\ C.) - Mz(37\ C.)] \quad (5)$$

This method is quite useful provided that the distribution of agent is even and widespread, because the concentration c will then tend to be constant and independent of both position and time, as we assumed it should. The SAT factor in Eq 4 can always be handled by using strong enough esr signal pulses to make SAT close to one both at 37 C. and t.

If, however, the agent is injected through the probe itself and only a small volume is used, the assumption that c is constant may fail. The agent might, for instance, diffuse into surrounding tissues so that the local value of c decreases with time.

This problem can, however, be solved by measuring the signals absorbed directly by the paramagnetic electrons in the agent. The esr signal strength is namely directly proportional to the factor cSAT in Eq 4. The preferred way of doing this is explained in "Radiofrequency FT EPR Spectroscopy and Imaging" by John Bourg et.al., in Journal of Magnetic Resonance, Series B 102, 112–115 (1993), (Reference 4), and in "Development and Optimization of Three-Dimensional Spatial EPR Imaging for Biological Organs and Tissues", by P. Kuppusamy et.al., Journal of Magnetic Resonance, Series B 106, 122–130 (1995) (Reference 5), and "Three-dimensional spectral-spatial EPR imaging of free radicals in the heart: A technique for imaging tissue metabolism and oxygenation", by Kuppusamy et.al., (Reference 6). Reference 4 teaches how to do Fourier transform pulsed esr imaging, in two dimensions. Reference 5 shows how the method can be performed in three dimensions, to form a complete image, and Reference 6 teaches how to use the method for imaging oxygen in vivo.

The preferred method is to use the type of pulsed spectrometer shown in FIG. 1 of reference 4, combined with the gradient pulsing explained in Reference 5. This combined method is, in fact, completely analogous to the way proton imaging is performed with the so called projection-reconstruction method, which is well known in NMR imaging. The difference is that the frequencies involved are much higher and the relaxation times much faster, by a factor close to 1000. The sequences therefore run much faster, which makes the practical implementation somewhat different, but the mathematics is identical.

Using these methods one can form a pair of esr images of the volume of interest, one corresponding to 37 C., one to t. The ratio of the esr signals can then be used to multiply the right side of Eq. 5 and in this way correct for the change in cSAT which might corrupt the result. Note that the correction does not have to be measured and calculated with the same shape or volume of voxels as the proton signals. If the concentration does not change too much it is enough to use a more coarse grid with larger voxels. This is convenient, because esr imaging is less well developed than proton imaging. Often it can be enough to excite the electrons in one or a few slabs passing through the region of interest. The signals will represent projections of the distribution of cSAT on the axis perpendicular to said slab.

In one example, in a main magnetic field of 0.23 Tesla, the electron spin resonance frequency was chosen to be 6.453 GHz and the heat treatment oscillator frequency was chosen to be 6.44 GHz, while the NMR r.f. excitation frequency was chosen to be 9.800 MHz, and the length of the central conductor 3 which overlapped the sheath 2 was 5 to 10 mm, and the contrast agent was one of the Trityls referred to earlier. In general, the electron spin resonance frequency could be in the range 2.5 GHz to 40 GHz, while the nuclear magnetic resonance frequency could be in the range of 4 MHz to 60 MHz, with the main field in the range of 0.1 T to 1.5 T.

Of course, variations are possible without departing from the scope of the invention. Thus, the heat treatment oscillator 16 could operate at the same frequency as the ESR operator 11, provided appropriate blocking elements were included in the circuit. While the contrast agent is shown to be injected into the hollow needle, if desired this could be injected at a separate location. The electromagnetic field is generated by antenna 3, but it could be generated by a coil at the tip if desired.

Other means of producing heat treatment are possible. For example, instead of using an electromagnetic field generated at the tip 3 of the probe 1 using heat treatment oscillator 16, laser heat treatment may be employed using an optical fiber passing through the needle 2. As another alternative, focused ultrasound could be used. External coils could even be used to produce the electromagnetic field to excite electron spin resonance instead of using the tip 1 of the probe 3, so that no invasive techniques at all need to be used, except possibly for the contrast agent. In all cases, the heat treatment will be controlled using the temperature dependence of the enhanced magnetic resonance signal to control and terminate the heat treatment process.

The tissue destroying heat treatment produced by the heat treatment oscillator, laser or focused ultrasound may be ablation. Alternatively, hyperthermia could be used. This method is similar to ablation. Technically, it is the same thing except that the heat treatment is done for a longer time at a lower temperature, typically 41–44 Celsius, so the same equipment and methods can be used. Clinically it recognizes that cancer cells are more sensitive to heating than normal ones.

While the nuclear magnetic resonance apparatus is magnetic resonance imaging apparatus, the invention is also applicable to nuclear magnetic resonance for spectroscopy, and while the apparatus has been described for use for investigating human tissue, the invention is applicable to the investigation of other animal tissues or inanimate materials.

The magnet could be a permanent magnet, a resistive electromagnet or a superconducting electromagnet.

The invention has been described in relation to its preferred embodiments. Obviously, modifications and alterations will occur to others upon reading and understanding the preceding description. It is intended that the invention be construed as including all such modifications and alterations insofar as they come within the scope of the appended claims or the equivalents thereof.

What is claimed is:

1. A nuclear magnetic resonance apparatus comprising:
   a main magnet for generating a magnetic field in an examination region;
   an r.f. transmit coil for exciting nuclear magnetic resonance in a region of interest of a subject disposed in the examination region;
   an r.f. receive coil for receiving nuclear magnetic resonance signals from the region of interest;
   a probe comprising a transmitter which generates an electromagnetic field in the region of interest at a first frequency which excites electron spin resonance in the region of interest; and
   means for directing the probe through soft tissue of the subject to the region of interest.

2. A nuclear magnetic resonance apparatus according to claim 1 wherein the transmitter is disposed at a distal end of the probe.

3. A nuclear magnetic resonance apparatus according to claim 1 wherein the probe further comprises:
   a tubular portion, the tubular portion having a bore extending through the tubular portion; and
   a conductor disposed within the bore of the tubular portion.

4. A nuclear magnetic resonance apparatus according to claim 3 wherein the transmitter comprises the tubular portion and the conductor.

5. A nuclear magnetic resonance apparatus according to claim 4 wherein the conductor extends past the distal end of the tubular portion by approximately one quarter of the wavelength of the electromagnetic field generated by the transmitter.

6. A nuclear magnetic resonance apparatus according to claim 3 wherein the tubular portion and conductor are moveable relative to one another in a direction along the length of the tubular portion when the probe is disposed at the region of interest.

7. A nuclear magnetic resonance apparatus according to claim 1 wherein the probe further comprises heat treatment means for performing heat treatment in the region of interest.

8. A nuclear magnetic resonance apparatus according to claim 7 further comprising heat treatment control means for controlling the heat treatment, said heat treatment control means comprising the nuclear magnetic resonance signals received from the region of interest.

9. A nuclear magnetic resonance apparatus according to claim 1 wherein the probe further comprises a passage for delivering a contrast agent to the region of interest for generating enhanced nuclear magnetic resonance signals of the region of interest.

10. A nuclear magnetic resonance apparatus according to claim 9 wherein the transmitter generates an electromagnetic field at a second frequency which excites electron spin resonance in the contrast agent in the region of interest.

11. A nuclear magnetic resonance apparatus according to claim 10 wherein the transmitter generates an electromagnetic field at a third frequency which performs heat treatment in the region of interest.

12. A nuclear magnetic resonance apparatus according to claim 11 further comprising heat treatment control means for controlling heat treatment in the region of interest using the received nuclear magnetic resonance signals from the region of interest.

13. A nuclear magnetic resonance apparatus according to claim 12 further comprising:
   means for measuring the electron spin resonance in the contrast agent in the region of interest; and
   means for accounting for changes in concentration of contrast agent in the region of interest using the measured electron spin resonance.

14. A probe for use in magnetic resonance and electron spin resonance heat treatment procedures, the probe comprising:
   a tubular portion having a length and a bore extending through the length of the tubular portion;
   a distal end portion for inserting the probe through soft tissue of a subject;
   a conductor disposed within the bore; and
   a transmitter for generating an electromagnetic field in a region of interest of the subject at a frequency which excites electron spin resonance in the region of interest.

15. A probe as claimed in claim 14 wherein the tubular portion comprises a needle.

16. A probe according to claim 14 wherein the transmitter comprises the tubular portion and the conductor.

17. A probe according to claim 16 wherein the conductor extends past the distal end of the tubular portion by approximately one quarter of the wavelength of the electromagnetic field generated by the transmitter.

18. A probe according to claim 16 wherein the tubular portion and conductor are moveable relative to one another in a direction along the length of the tubular portion when the probe is disposed at the region of interest.

19. A probe according to claim 14 further comprising a passage for delivering a contrast agent to the region of interest.

20. A method of magnetic resonance imaging comprising:
   generating a main magnetic field in an examination region;
   exciting magnetic resonance in a region of interest of a subject disposed in the examination region;
   receiving unenhanced magnetic resonance signals from the region of interest;
   inserting a probe through soft tissue of the subject into the region of interest;
   exciting electron spin resonance in the region of interest using a transmitter disposed at a distal end of the probe; and
   receiving enhanced nuclear magnetic resonance signals from the region of interest.

21. A method of magnetic resonance imaging according to claim 20 wherein the transmitter comprises:
   a needle, the needle having a longitudinal axis and a bore extending through the needle along the longitudinal axis; and
   a conductor disposed within the bore of the needle.

22. A method of magnetic resonance imaging according to claim 20 further comprising the step of injecting a contrast agent into the region of interest using the probe.

23. A method of magnetic resonance imaging according to claim 22 wherein the step of exciting electron spin resonance signals comprises exciting electron spin resonance in the contrast agent.

24. A method of magnetic resonance imaging according to claim 23 further comprising receiving electron spin resonance signals from the contrast agent.

25. A method of magnetic resonance imaging according to claim 24 further comprising causing heat treatment in the region of interest using the transmitter.

26. A method of magnetic resonance imaging according to claim 25 further comprising controlling the heat treatment using the unenhanced and enhanced nuclear magnetic resonance signals.

27. A method of magnetic resonance imaging according to claim 26 further comprising controlling the heat treatment using the received electron spin resonance signals.

* * * * *